(12) United States Patent
Pan et al.

(10) Patent No.: US 8,765,550 B2
(45) Date of Patent: *Jul. 1, 2014

(54) N-CHANNEL ERASABLE PROGRAMMABLE NON-VOLATILE MEMORY

(75) Inventors: Shanjen Pan, Allen, TX (US); Alan T. Mitchell, Heath, TX (US); Jack G. Qian, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 104 days.

This patent is subject to a terminal disclaimer.

(21) Appl. No.: 13/366,668

(22) Filed: Feb. 6, 2012

(65) Prior Publication Data

US 2013/0016570 A1    Jan. 17, 2013

Related U.S. Application Data

(60) Provisional application No. 61/507,179, filed on Jul. 13, 2011.

(51) Int. Cl.
*H01L 21/336* (2006.01)
*H01L 29/788* (2006.01)

(52) U.S. Cl.
USPC ........................................... 438/257; 257/315

(58) Field of Classification Search
USPC .................................................. 438/257, 281
See application file for complete search history.

(56) References Cited

U.S. PATENT DOCUMENTS 6,965,142 B2 *   11/2005   Diorio et al. ................. 257/315
2012/0292682 A1 * 11/2012   Pan et al. ..................... 257/315

* cited by examiner

*Primary Examiner* — Zandra Smith
*Assistant Examiner* — Damian A Hillman
(74) *Attorney, Agent, or Firm* — John R. Pessetto; Frederick J. Telecky, Jr.

(57) ABSTRACT

In an embodiment of the invention, a method of fabricating a floating-gate NMOSFET (n-type metal-oxide semiconductor field-effect transistor) is disclosed. A silicide blocking layer (e.g. oxide, nitride) is used not only to block areas from being silicided but to also form an insulator on top of a poly-silicon gate. The insulator along with a top electrode (control gate) forms a capacitor on top of the poly-silicon gate. The poly-silicon gate also serves as the bottom electrode of the capacitor. The capacitor can then be used to capacitively couple charge to the poly-silicon gate. Because the poly-silicon gate is surrounded by insulating material, the charge coupled to the poly-silicon gate may be stored for a long period of time after a programming operation.

10 Claims, 14 Drawing Sheets

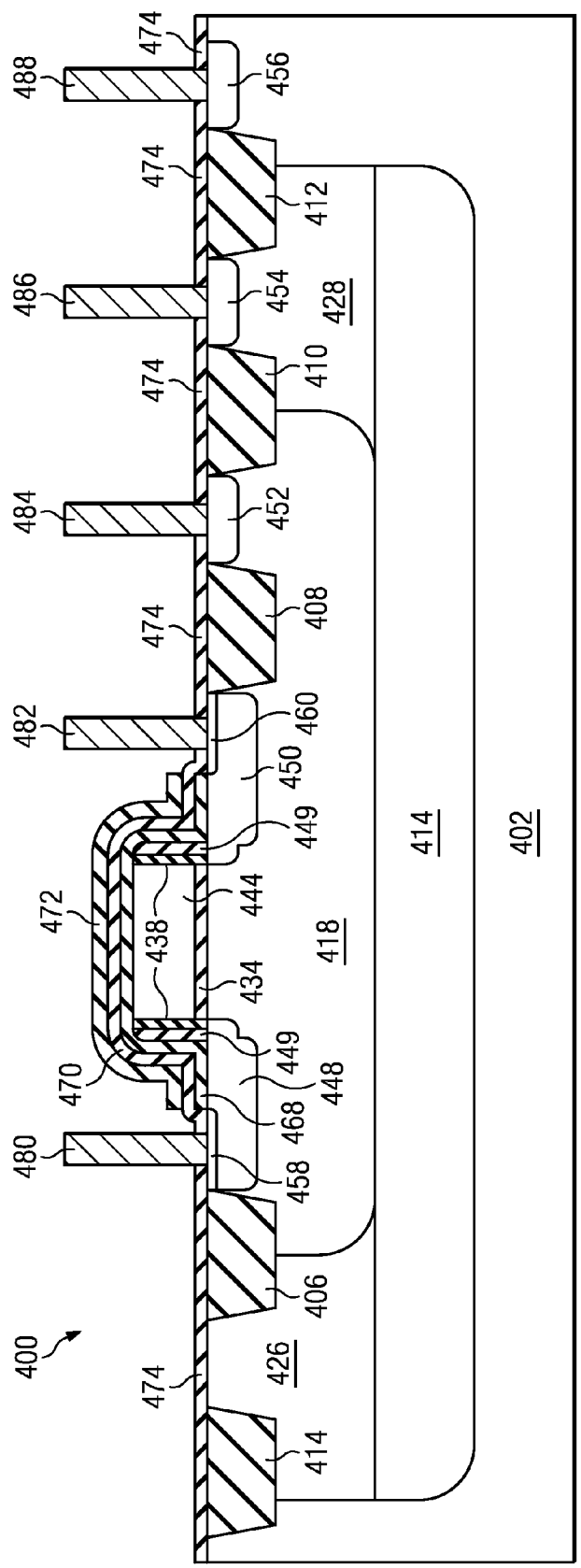
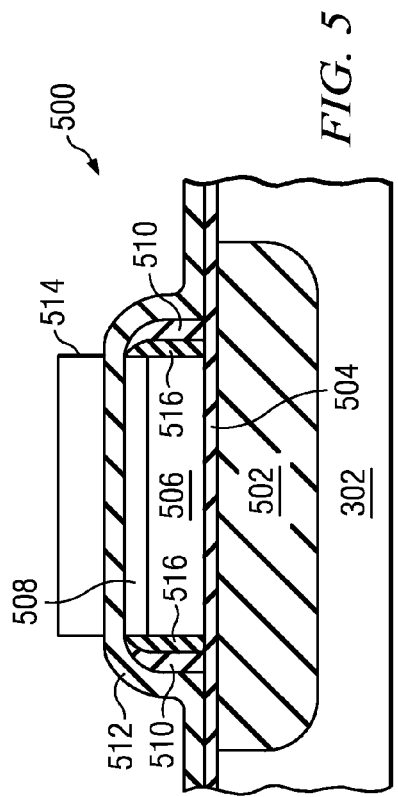
FIG. 4
FIG. 5

N-CHANNEL ERASABLE PROGRAMMABLE NON-VOLATILE MEMORY

BACKGROUND

A programmable read-only memory (PROM), a field programmable read-only memory (FPROM), an electrically erasable programmable read-only memory (EEPROM) and a one-time programmable non-volatile memory (OTP NVM) are forms of digital memory where the setting of each bit is locked by a fuse or an anti-fuse. These PROMs may be used to store programs permanently. One difference between a read-only memory (ROM) and a PROM is that with a PROM the programming is applied after the device is constructed.

PROMs are often manufactured blank and depending on the technology can be programmed on a wafer, during final test, or in a system. The availability of this technology allows companies to maintain a supply of blank PROMs in stock, and program them at the last minute to avoid a large volume commitment. These types of memories are frequently seen in video game consoles, mobile phones, radio-frequency identification tags, implantable medical devices, high-definition multimedia interfaces and in many other consumer and automotive electronic products.

An EEPROM can be erased and reprogrammed (written to) repeatedly through the application of higher than normal electrical voltage generated externally or internally in the case of modern EEPROMs. EEPROMs can be programmed and erased in the circuit in which they are found. The number of times an EEPROM can be written is limited. In many applications, the limitation is approximately a million write operations. For this reason EEPROMs are typically used to provide configuration information rather than random information.

In some embodiments of an EEPROM, a FGMOSFET (floating gate metal oxide semiconductor field effect transistor) is used. The structure of a FGMOSFET) is similar to a conventional MOSFET (metal oxide semiconductor field effect transistor). The gate of the FGMOSFET is electrically isolated to create a floating node. One or more inputs are deposited above the floating gate and are electrically isolated from it. These inputs are only capacitively connected to the floating gate. Since the floating gate is surrounded by highly resistive material (insulators), the charge contained on the floating gate remains unchanged for a long period of time. Usually Fowler-Nordheim tunneling or hot-carrier injection mechanisms are used to modify the amount of charge stored on the floating gate.

In many IC processes, extra processing steps are required to produce FGMOSFETs along with MOSFETs. These extra steps increase the cost of making integrated circuits that contain FGMOSFETs and MOSFETs. A process that reduces the number of steps to manufacture FGMOSFETs along with MOSFETs is desirable.

BRIEF DESCRIPTION OF THE DRAWINGS

FIG. 4 is cross sectional view of an embodiment of a floating-gate n-type MOSFET illustrating where programming and erasing voltages may be applied.

FIG. 5 is cross sectional view of an embodiment of an analog capacitor.

DETAILED DESCRIPTION

The drawings and description, in general, disclose a method of fabricating a floating-gate NMOSFET (n-type metal-oxide semiconductor field-effect transistor), an NMOSFET and an analog capacitor on the same substrate. In one embodiment, a silicide blocking layer (e.g. oxide, nitride) is used not only to block areas from being silicided but to form an insulator on top of a poly-silicon gate. The insulator, along with a top electrode (control gate), forms a capacitor on top of the poly-silicon gate. The poly-silicon gate also serves as the bottom electrode of the capacitor. The capacitor can then be used to capacitively couple charge to the poly-silicon gate. Because the poly-silicon gate is surrounded by insulating material, the charge coupled to the poly-silicon gate may be stored for a long period of time after a programming operation.

In an embodiment of the invention, the floating-gate NMOSFET may be programmed by applying a positive voltage (e.g. a voltage greater than 6 volts) to the control gate of the floating-gate NMOSFET, applying a positive voltage (approximately 4.5 volts) to the drain of the floating-gate NMOSFET and grounding the source and Pwell (P-type well) of the floating-gate NMOSFET. Applying positive voltages to the control gate of the floating-gate NMOSFET while grounding the drain and Pwell of the floating-gate NMOSFET causes injection of electron into the floating gate by hot-electron injection.

The charge on the floating-gate NMOSFET may be changed (erased) by grounding the electrode (control gate) of the capacitor formed by silicide blocking material while applying a positive voltage to the Nwell, the source and the drain of the floating-gate NMOSFET. Grounding the control gate of the floating-gate NMOSFET while applying a positive voltage to the Nwell, the source and the drain of the floating-gate NMOSFET causes Fowler-Nordheim tunneling which causes electrons to be removed from the floating-gate.

In this embodiment, a NMOSFET and an analog capacitor are also fabricated concurrently with a floating-gate NMOSFET. When a NMOSFET or an analog capacitor is fabricated, the silicide blocking material is not deposited on the poly-silicon gate to block the silicide. Rather, the poly-silicon gate is allowed to be silicided. Because a floating-gate NMOSFET, an NMOSFET and an analog capacitor may be fabricated on the same substrate using similar processing steps, an EEPROM cell along with analog circuits may be fabricated at a relatively low cost.

Figure 1:
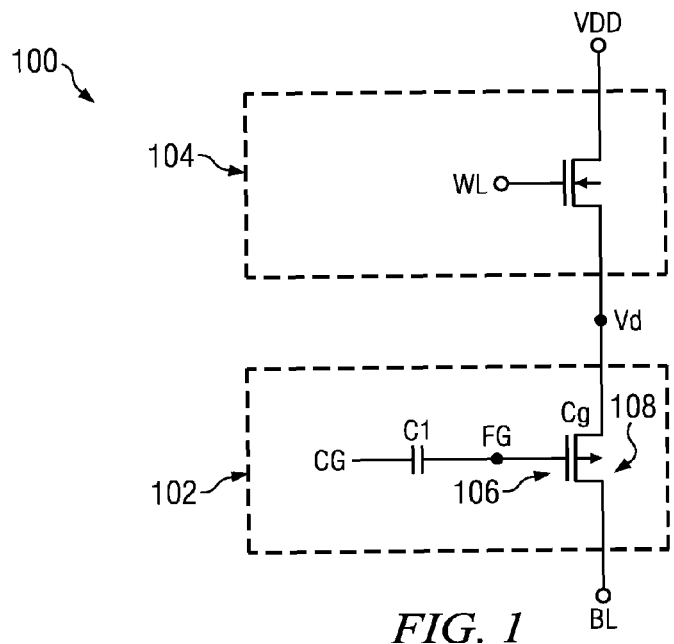
FIG. 1 is a schematic drawing of an embodiment of a programmable non-volatile EEPROM memory cell.

FIG. 1 is a schematic drawing of an embodiment of a programmable non-volatile EEPROM memory cell 100. The memory cell 100 contains an NMOSFET 104 and a floating-gate NMOSFET 102. The drain of the NMOSFET 104 is electrically connected to power supply VDD. The gate of PMOSFET 104 is electrically connected to a word line WL in an array of programmable non-volatile EEPROM memory cells (See FIG. 2). The source of the PMOSFET 104 is electrically connected to the drain Vd of the floating gate NMOSFET 102.

The floating-gate NMOSFET 102 has a capacitor C1 connected in series with gate capacitance Cg. The capacitor C1 has an electrode CG (control gate) and an electrode FG. The floating gate FG is electrically insulated from other electrodes. Because the floating gate FG is electrically insulated from other electrodes, the floating gate FG "floats" and is able to retain charge for a long period of time. The source of NMOSFET is electrically connected to a bit line BL.

The floating-gate NMOSFET 102 may be programmed, in this example, by applying the following conditions for approximately 100 micro-seconds: 1) applying a programming voltage Vpp in place of the operating voltage Vdd while applying approximately 5 volts to the gate WL of NMOSFET 104, 2) applying more than 6 volts to the control gate CG and 3) grounding the Pwell 108 and the bit line BL.

The charge on the floating-gate NMOSFET 102 may be erased by applying approximately 0 volts on the electrode CG and approximately 15 volts on the Pwell 108, the drain Vd, and the source BL of the NMOSFET 106 for approximately 20 milli-seconds.

The programmable non-volatile EEPROM memory cell 100 may be read by applying approximately 1.2 volts, for example, on the word line WL. When the floating-gate NMOSFET 102 is programmed, there is a positive charge on the poly floating gate FG which causes an inversion layer to form in the channel of the floating-gate NMOSFET 102. The inversion layer will then conduct current to a bit line BL where a sense amp (not shown) at the end of the bit line BL will detect a change in voltage or current. The change in voltage or current may then be amplified by the sense amp to provide a logical digital output. When no inversion layer is formed in the channel of the floating-gate PMOSFET, no current can be conducted through the floating-gate PMOSFET.

Figure 2:
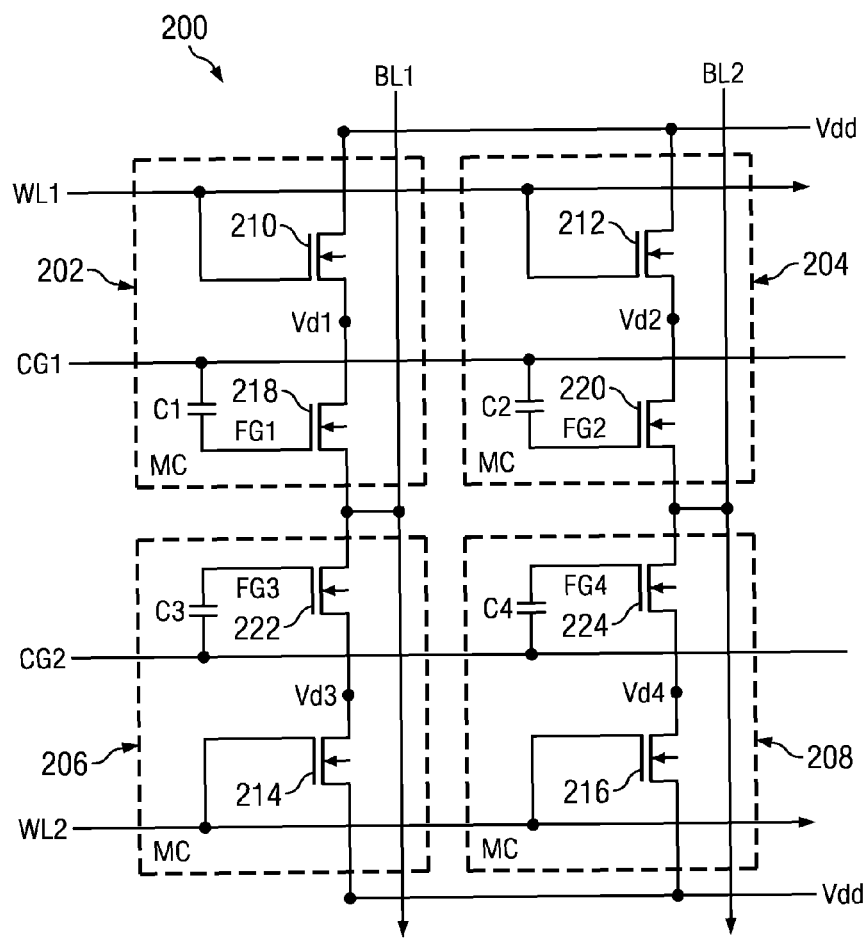
FIG. 2 is a schematic drawing of an embodiment of four programmable non-volatile EEPROM memory cells.

FIG. 2 is a schematic drawing of an embodiment of an array 200 with four programmable non-volatile EEPROM memory cells 202, 204, 206 and 208. A programmed memory cell, for example memory cell 202, may be read by applying 1.2 volts on word line WL1. With 1.2 volts applied to word line WL1, current or voltage may be sensed by a sense amp (not shown) on bit line BL1. In this example, word line WL2 is held at ground. Because word line WL2 is held at ground, the logical state of memory cell 206 can not be read and does not interfere with the reading of memory cell 202 on bit line BL1.

In memory 200, memory cell 202 may be programmed, in this example, by applying the following conditions for approximately 100 micro-seconds: 1) applying a programming voltage Vpp (e.g. 5 volts) in place of the operating voltage Vdd while applying 5 volts to the gate WL1 of NMOSFET 210, 2) applying more than 6 volts to the control gate CG1 and 3) grounding the Pwell of floating-gate NMOSFET 218 and the bit line BL1. Word line WL2 is held at ground during the programming of memory cell 202.

In this example after memory cell 202 is programmed, memory cell 208 may be programmed, by applying the following conditions for approximately 100 micro-seconds: 1) applying a programming voltage Vpp (e.g. 5 volts) in place of the operating voltage Vdd while applying 5 volts to the gate WL2 of NMOSFET 216, 2) applying more than 6 volts to the control gate CG2 and 3) grounding the Pwell of floating-gate NMOSFET 224 and the bit line BL2. Word line WL1 is held at ground during the programming of memory cell 208.

Figure 3A:
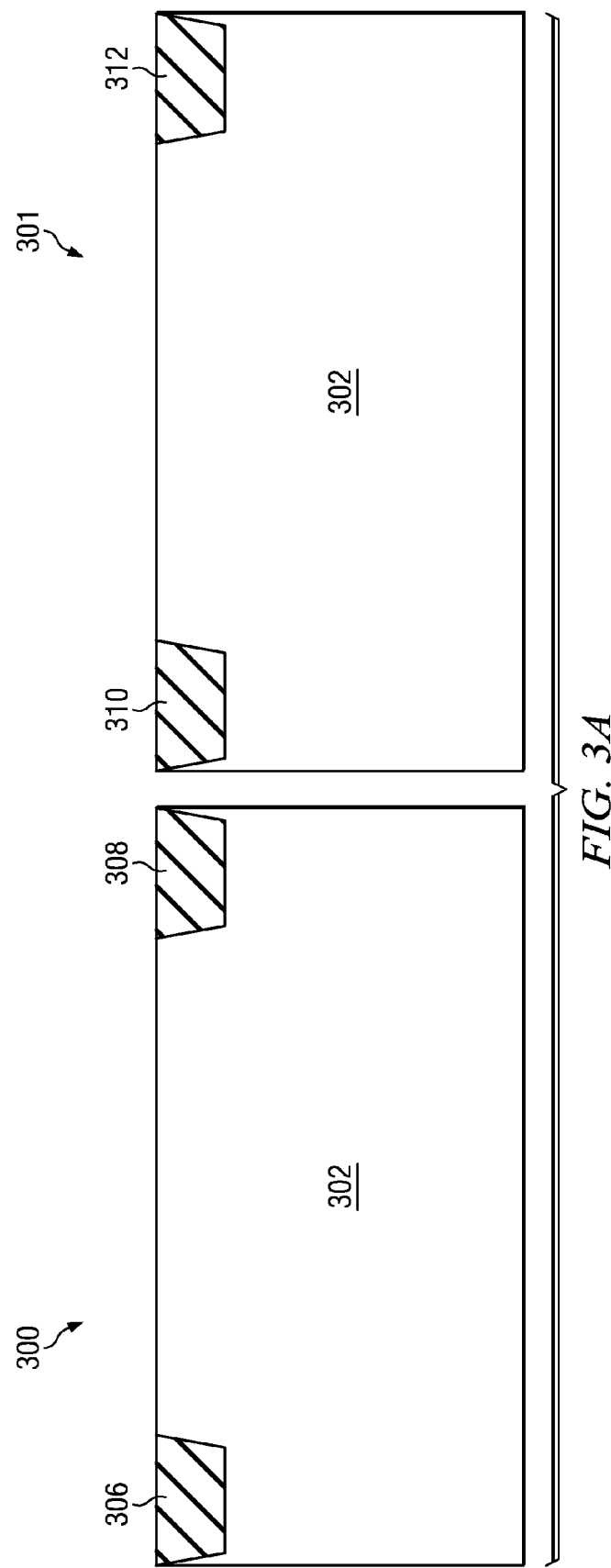
FIGS. 3A-3L are cross sectional views of an embodiment of a method for fabricating a floating-gate p-type MOSFET and a p-type MOSFET concurrently.
Figure 3B:
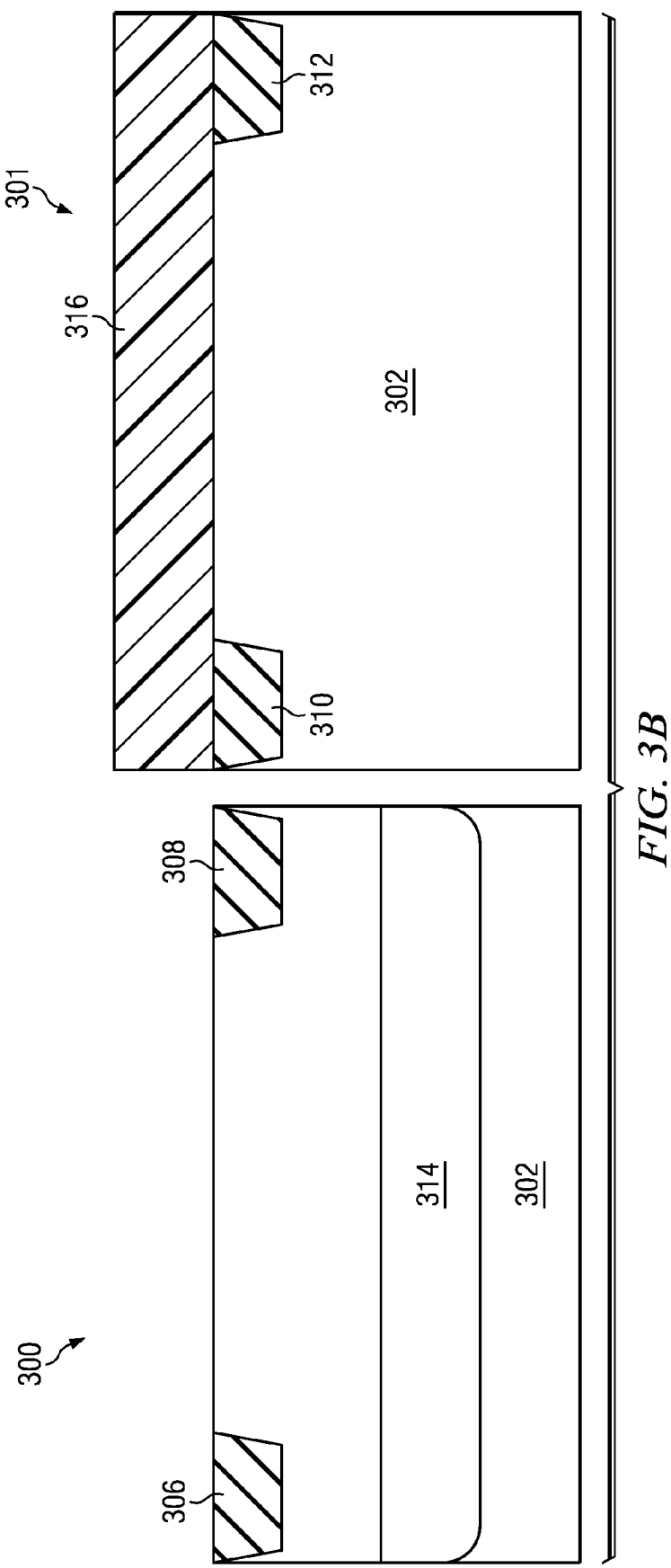

FIGS. 3A-3L are cross sectional views of an embodiment of a method for fabricating a floating-gate n-type MOSFET 300 and a n-type MOSFET 301 concurrently. The cross-sectional view shown in FIG. 3A shows thick oxide regions 306, 308, 310, 312 formed in substrate 302. The substrate 302 in this example is a p-type substrate. In this example swallow-trench isolation (STI) is used to form the thick oxide regions 306, 308, 310, 312. However, in another embodiment local oxidation of silicon (LOCOS) may be used to form the thick oxide regions 306, 308, 310, 312. The cross-sectional view shown in FIG. 3B illustrates a deep Nwell (DNwell) 314 implanted into the substrate 302 of floating-gate n-type MOSFET 300. A resist 316 is applied to prevent a DNwell from being formed in the substrate 302 of the n-type MOSFET 301.

Figure 3C:
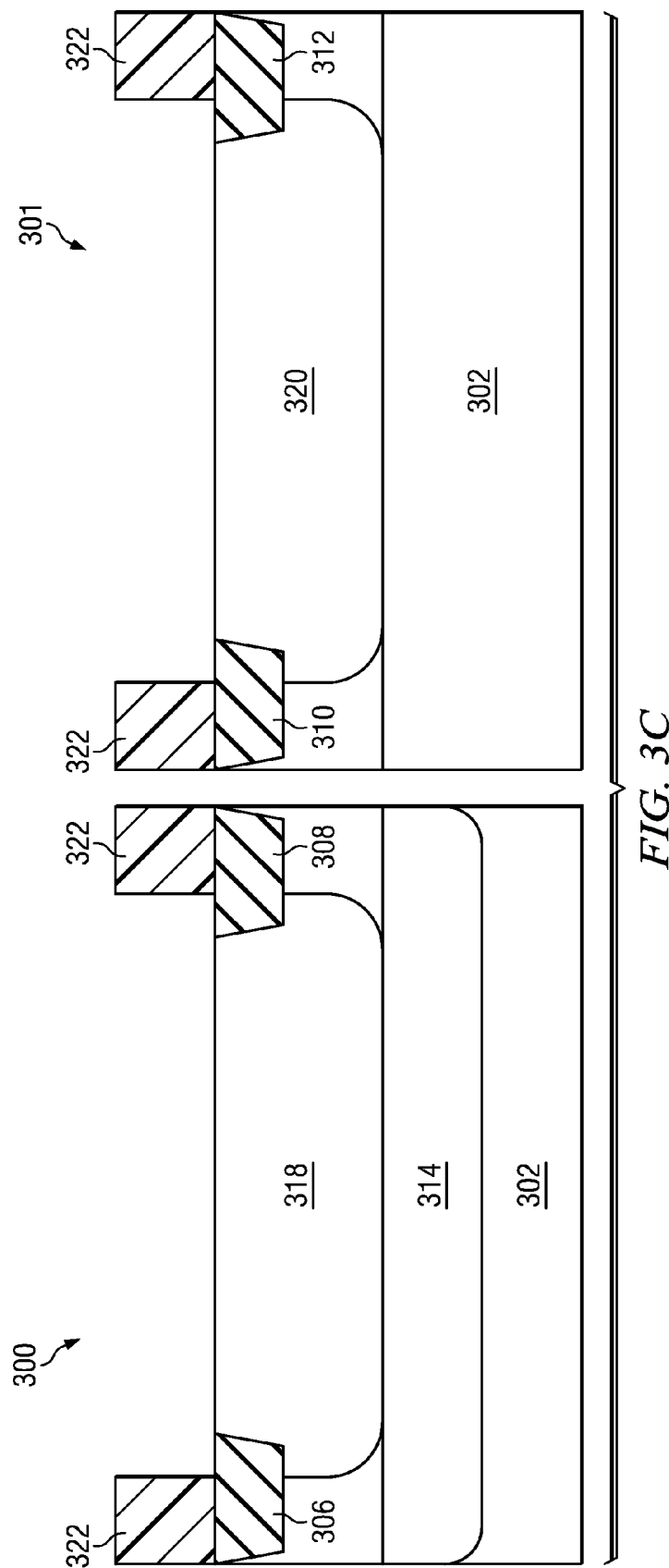
Figure 3D:
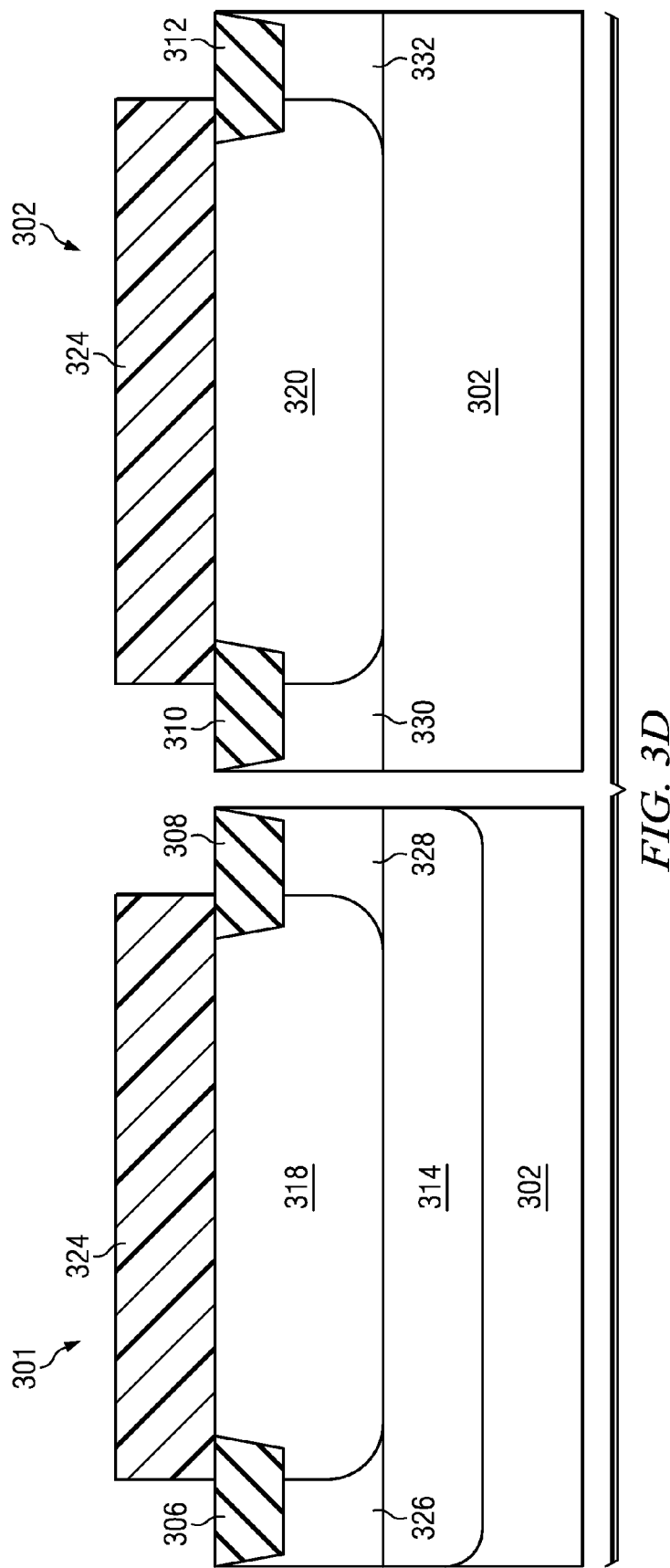
Figure 3E:
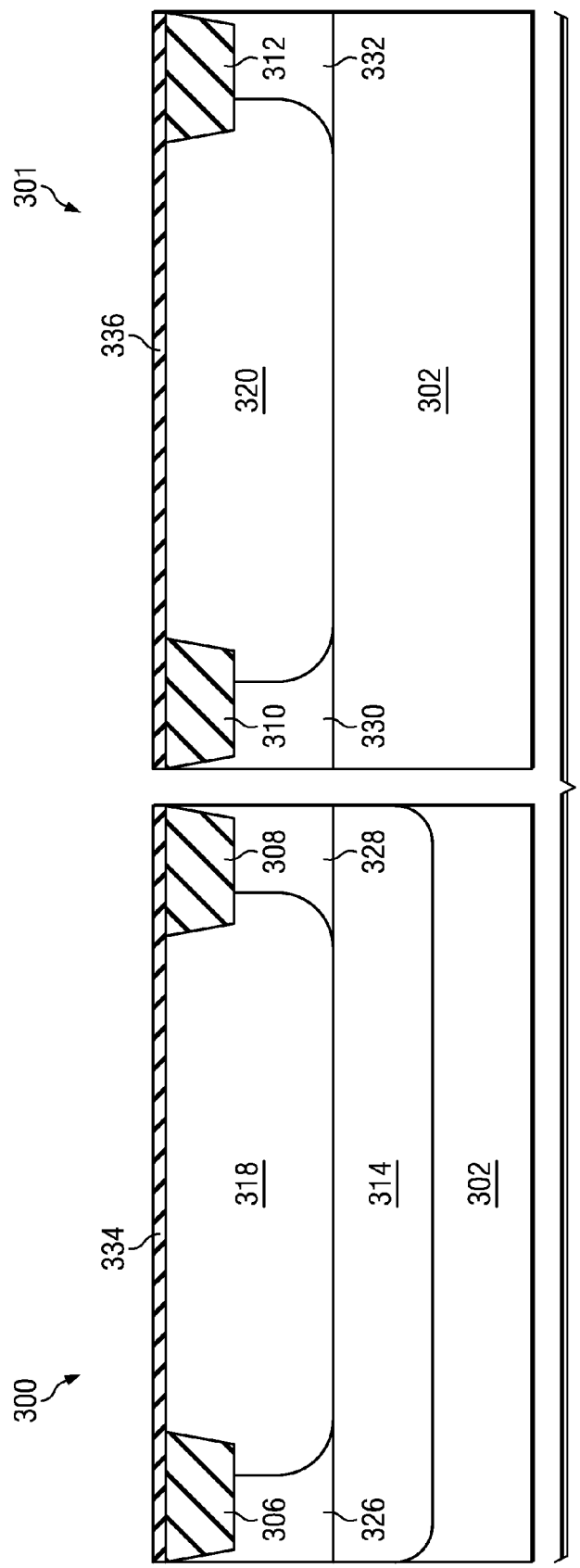

The cross-sectional view shown in FIG. 3C illustrates two Pwells regions 318 and 320 formed in the substrate 302. The resist 322 is applied to prevent the Pwell implant from going through the thick oxide regions 306, 308, 310, 312 into the substrate 302. After the resist 322 is removed, another resist 324 is applied over the Pwells 318 and 320 and portions of the thick oxide regions 306, 308, 310 and 312 as shown in FIG. 3D. Nwells 326, 328, 330 and 332 are implanted through thick oxide regions 306, 308, 310 and 312 respectively as shown in FIG. 3D. The cross-sectional view shown in FIG. 3E illustrates insulation 334 and 336 grown over the Pwell regions 318, 320 and on the thick oxide regions 306, 308, 310, 312. The insulation 334 and 336 may comprise an oxide, a nitride and a combination of an oxide and nitride, for example. The insulation 334 and 336 may also be a high K dielectric insulator.

Figure 3F:
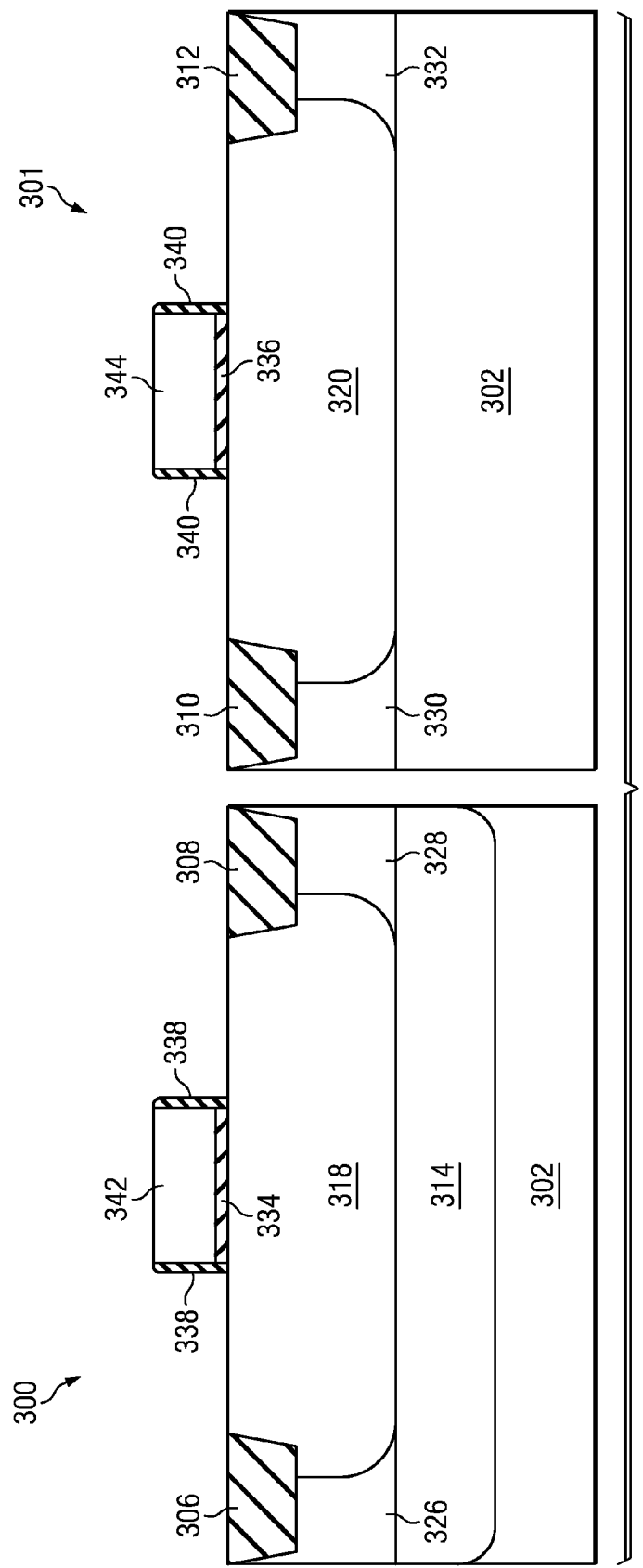
Figure 3G:
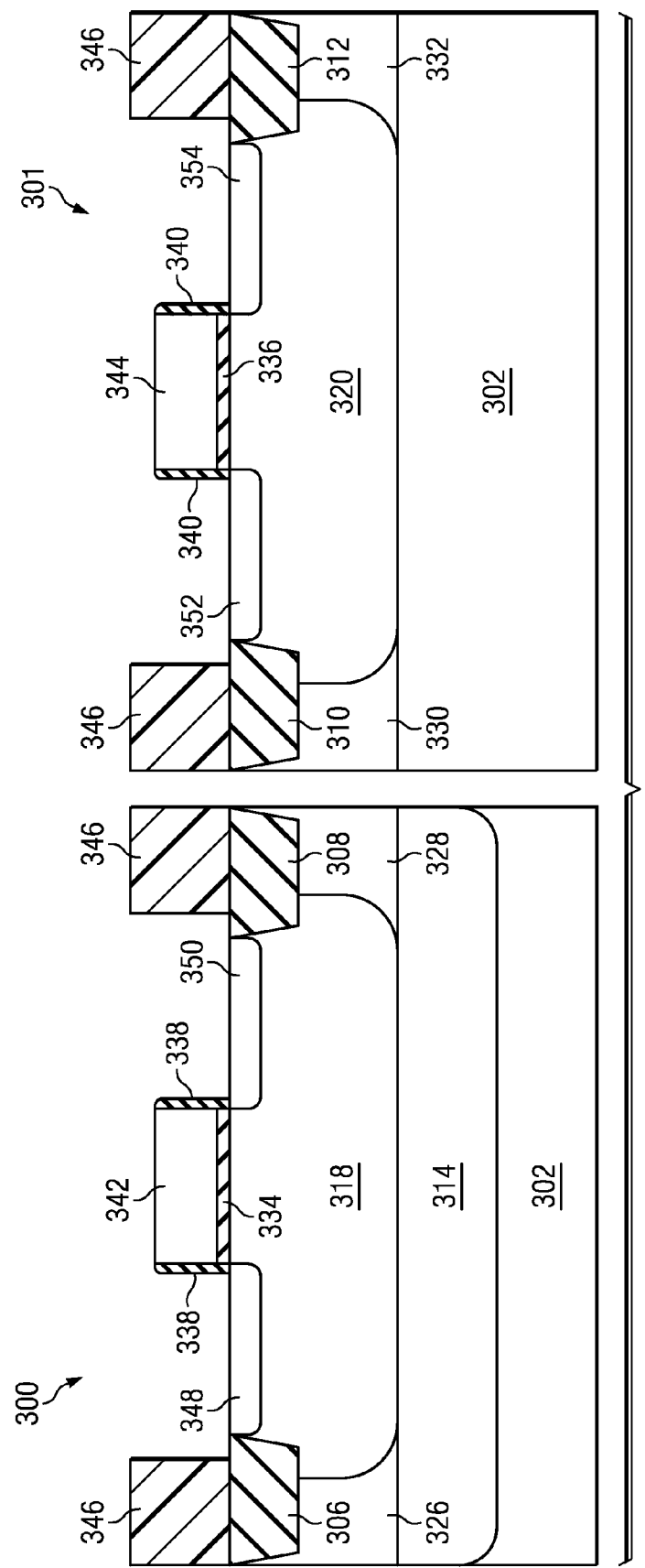
Figure 3H:
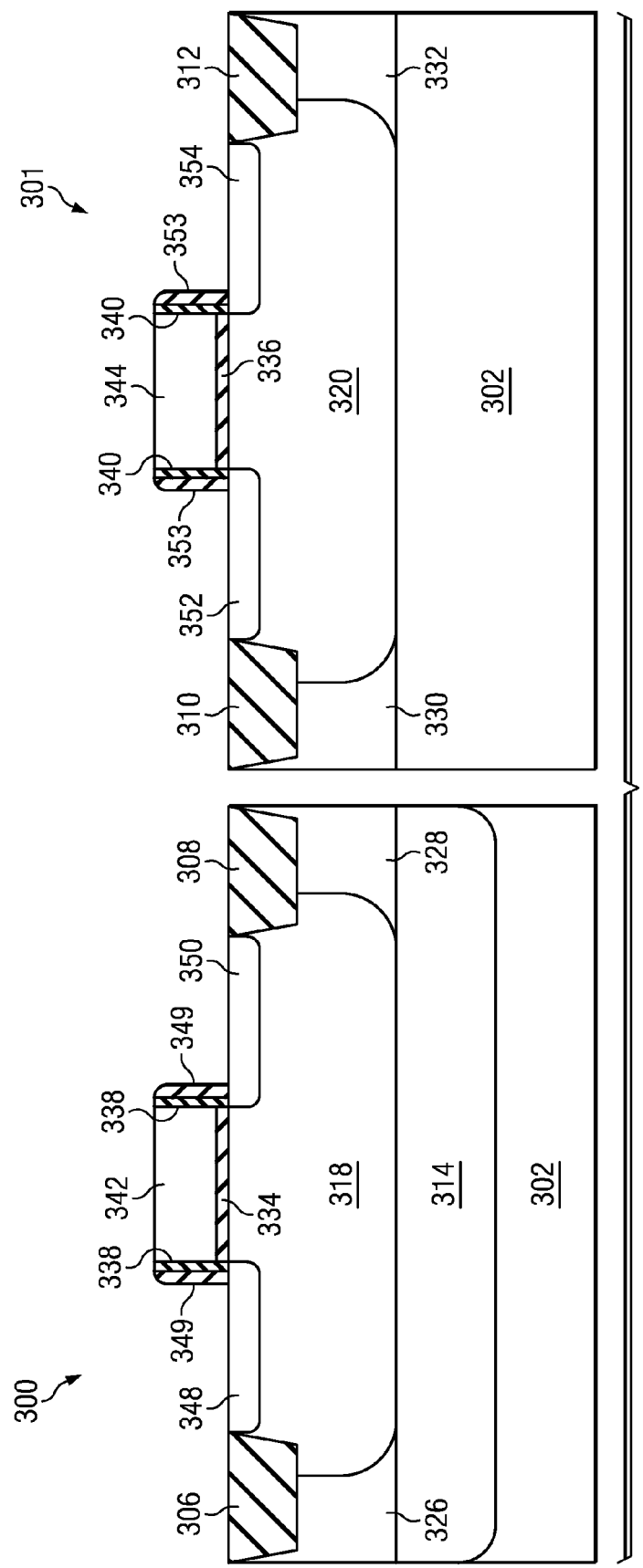

After the insulation 334 and 336 is grown, a poly-silicon layer is deposited over the insulation regions 334 and 336. The poly-silicon layer is then etched to form poly-silicon gates 342 and 344 as shown in FIG. 3F. Also, shown in FIG. 3F are oxide side-walls 338 and 340 grown on poly-silicon gates 342 and 344 respectively. FIG. 3G illustrates a resist 346 deposited over portions of the thick-oxide regions 306, 308, 310 and 312. While the resist 346 is deposited over portions of the thick-oxide regions 306, 308, 310 and 312, a source 348 and a drain 350 for poly-silicon gate 342 and a source 352 and a drain 354 for poly-silicon gate 344 are formed by ion-implantation. After the sources 348, 352 and the drains 350, 354 are formed, the resist 346 is removed. FIG. 3H illustrates nitride side-walls 349 and 353 grown on oxide side walls 338 and 340 respectively.

Figure 3I:
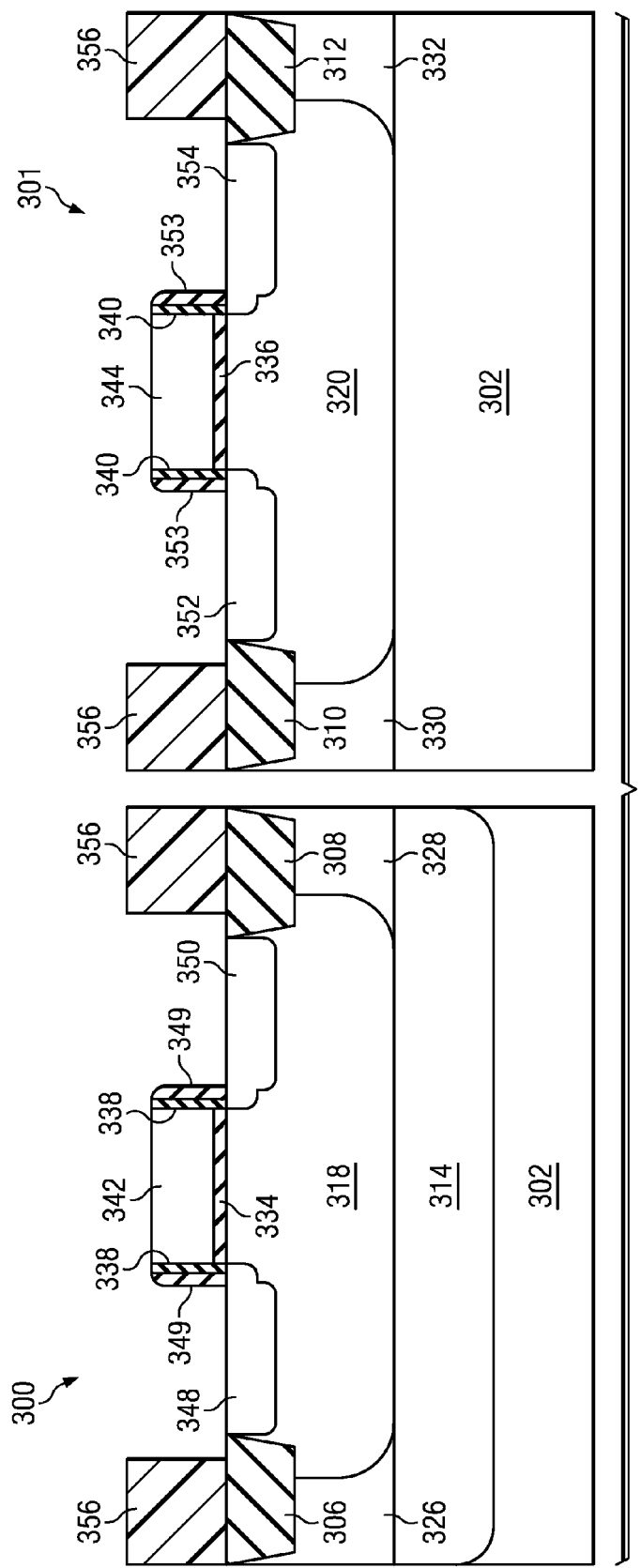

FIG. 3I illustrates a resist 356 deposited over portions of the thick-oxide regions 306, 308, 310 and 312. After the resist 356 is deposited over portions of the thick-oxide regions 306, 308, 310 and 312, a second implantation is made in the source 348 and drain 350 of poly-silicon gate 342 and the source 352 and drain 354 of poly-silicon gate 344 are formed by ion-implantation. After the sources 348, 352 and the drains 350, 354 have been implanted for a second time, the resist 356 is removed.

Figure 3J:
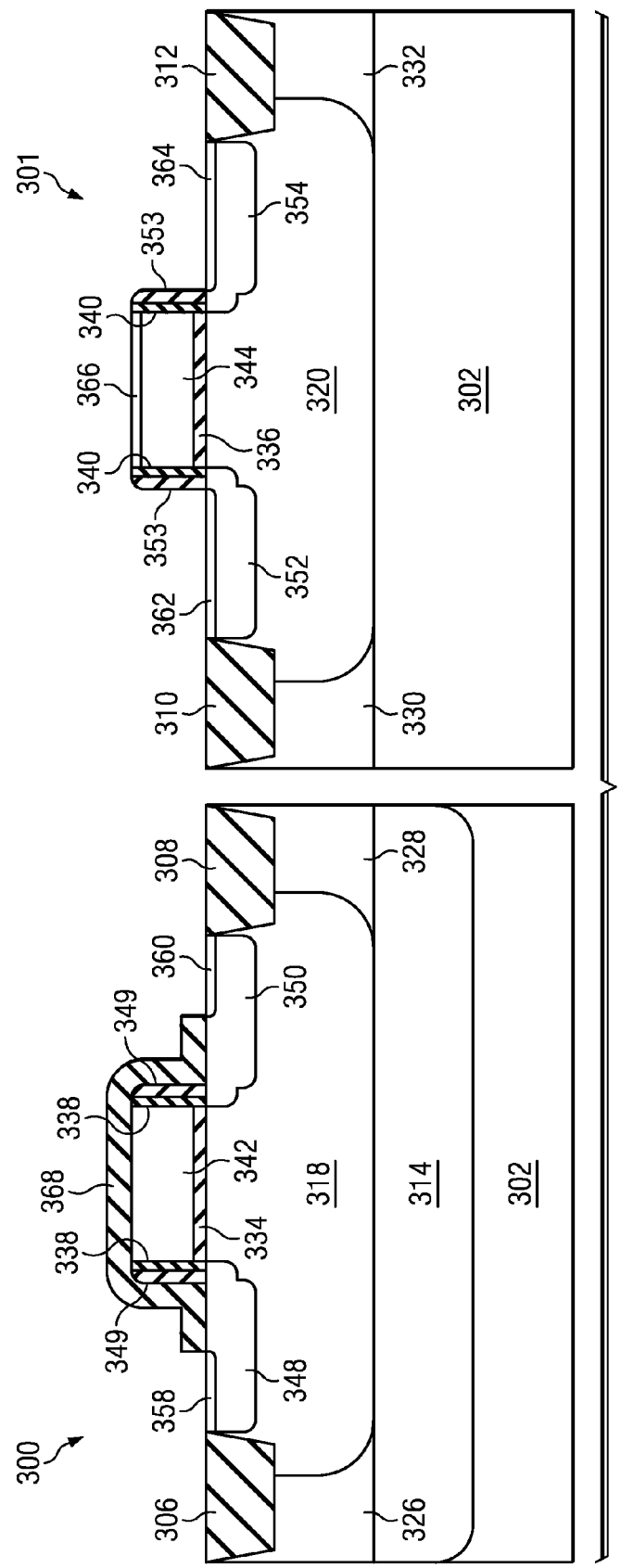

FIG. 3J illustrates a silicide blocking layer 368 that is deposited and then patterned to protect areas of a silicon surface from being silicided. A thin transition metal layer is fully formed and patterned over semiconductor devices 300 and 301. The substrate 302 is heated, allowing the transition metal to react with exposed silicon in the active regions of the semiconductor device (e.g., sources 348, 352, drains 350, 354, gate 366) forming low-resistance transition metal silicides 358, 360, 362, 364 and 366. The transition metal does not react with the silicide blocking layer 368. Silicon dioxide and/or silicon nitride insulator, for example, may be used as a silicide blocking layer 368.

Figure 3K:
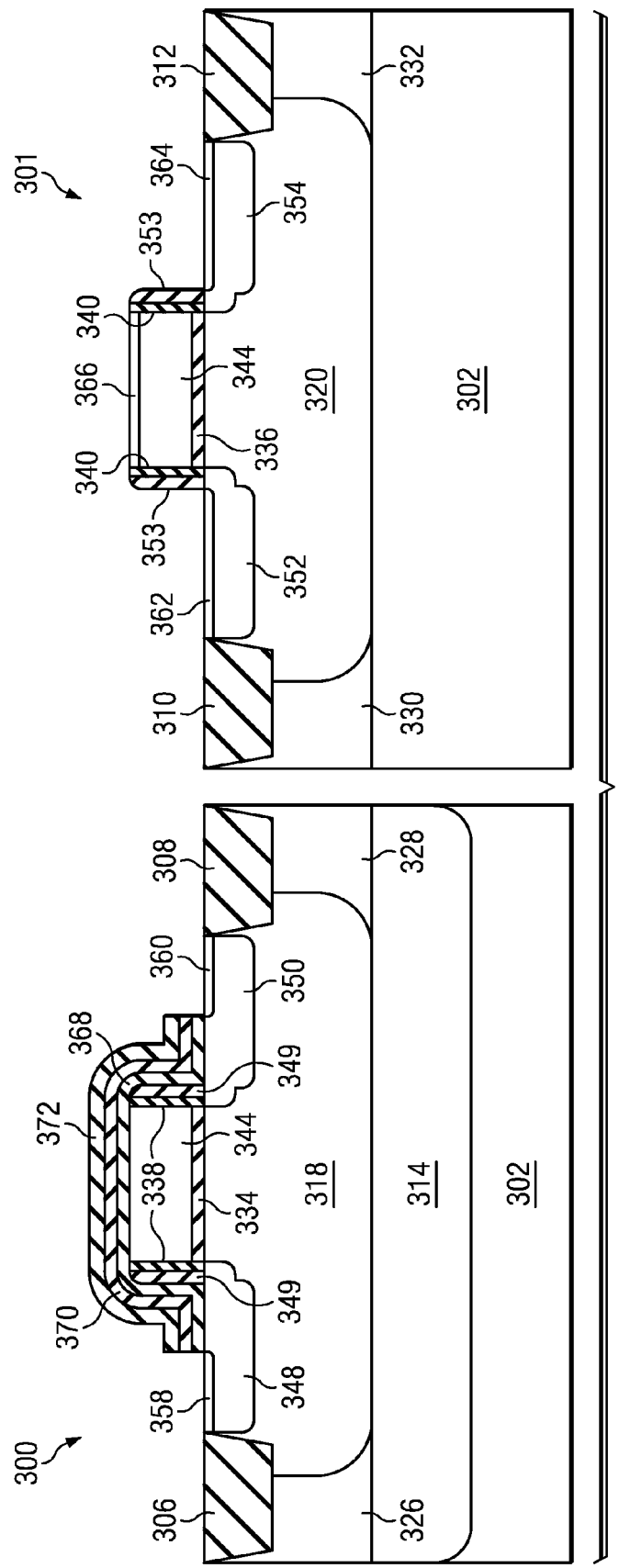
Figure 3L:
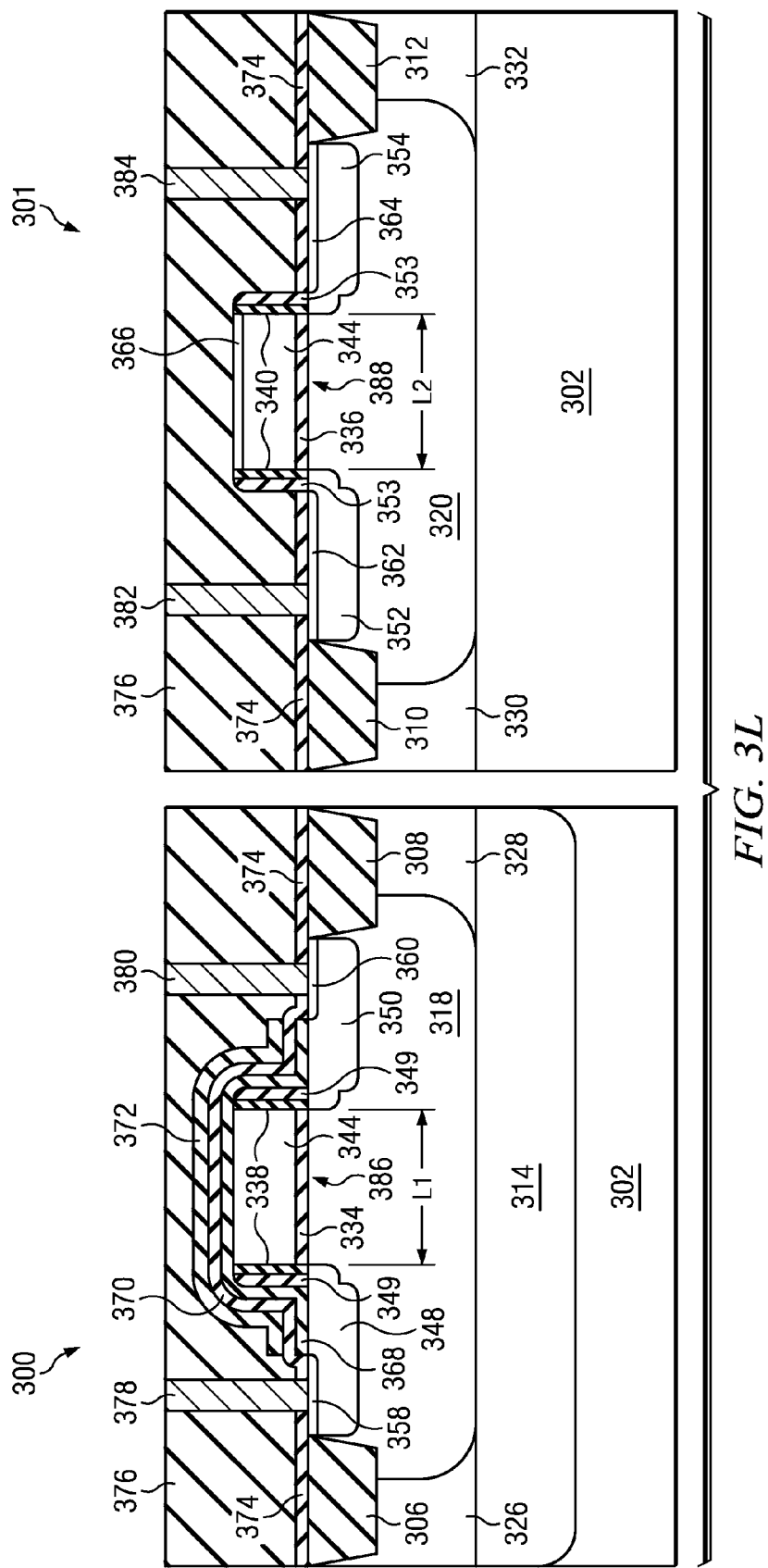

FIG. 3K illustrates a part of the process where a nitride layer 370 is formed on the silicide blocking layer 368. After forming the nitride layer 370, a conductive layer 372 is formed on the nitride layer 370. The conductive layer 372 acts as a second electrode CG for the capacitor C1 (FIG. 1). In an embodiment of the invention, the silicide blocking layer 368 and the nitride layer 370 are also used as an insulator to form a capacitor C1 (FIG. 1) in series with the capacitor Cg formed by the insulator 334 under the poly-silicon gate 344. The poly-silicon gate 344 forms one electrode for capacitor C1 and for the capacitor Cg (FIG. 1). The conductive layer 372 is also used in the formation of analog capacitors as is explained in more detail later. The conductive layer 372 may be formed using, for example, TaN, TiN or poly-silicon Next a SiN layer 374 is deposited over the top of all areas as shown in FIG. 3L. The SiN layer 374 is used as a contact etch stop. After the SiN layer 374 is formed, a phosphorus-doped silicate glass (PSG) layer 376 is formed over both the floating-gate N-type MOSFET 300 and the N-type MOSFET 301. The PSG layer 376 is then etched, stopping at SiN layer 374. SiN layer 374 is then etched. After the PSG layer 376 is etched, metal (e.g. tungsten) is deposited to form metal contacts 378, 380, 382 and 384 to the source and drains 348, 350, 352, 354 of the floating-gate N-type MOSFET 300 and the N-type MOSFET 301.

The channel length L1 of floating-gate N-type MOSFET 300 and the channel length L2 of N-type MOSFET 301 are shown in FIG. 3L. The channel region 386 of floating-gate N-type MOSFET 300 is located below the insulator 334 and between the source 348 and drain 350 of floating-gate N-type MOSFET 300 while the channel region 388 of N-type MOSFET 301 is located below the insulator 336 and between the source 352 and drain 354 of floating-gate N-type MOSFET 301.

FIG. 4 is cross sectional view of an embodiment of a floating-gate n-type MOSFET 400. This embodiment of a floating-gate n-type MOSFET illustrates how contacts may be made to the source 348, the drain 450, the Pwell 418, the Nwells 426, 428, the Dwell 414 and the P-type substrate. In this embodiment, the floating-gate N-type MOSFET 400 is fabricated on a substrate P-type substrate 402. The voltage on the P-type substrate 402 may be applied through conductive material 488 and ohmic contact 456. The voltage on the Pwell 418 may be applied through conductive material 484 and ohmic contact 452. The voltage on the Nwells 426 and 428 and the Dwell 414 may be applied through conductive material 486 and ohmic contact 454.

The conductive layer 472 may be used to apply voltages for programming and erasing the floating-gate n-type MOSFET 400. The voltages on the source 448 and the drain 450 may be applied through conducting material 480 and 482 respectively. Because the floating-gate n-type MOSFET 400 is isolated by the Pwell 418, the floating-gate n-type MOSFET 400 may be programmed and erased using only positive voltages.

The poly-silicon gate 444 has oxide side-walls 438 and nitride side-walls 449. The source 448 and the drain 450 have silicided portions 458 and 460 respectively. The poly-silicon gate 450, the side-walls, 438, 442 and portions of the source 448 and the drain 450 are covered by a silicide blocking layer 468. A nitride layer 470 covers the silicide blocking layer 468. A conducting layer 472 covers the nitride layer 470. A SiN layer 474 covers the STI regions 406, 408, 410, 412, 414 and portions of the source 448 and the drain 408.

An analog capacitor may also be fabricated concurrently, on a common substrate 302, with the floating-gate N-type MOSFET 300 and the N-type MOSFET 301 shown in FIG. 3L. FIG. 5 is a cross-sectional view of an embodiment of an analog capacitor 500. The analog capacitor 500 may serve, for example, as a capacitor within the same electrical circuit incorporating a float-gate N-type MOSFET or in another circuit.

A lower plate of analog capacitor 500 is formed of another instance of poly-silicon 506 and metal silicide 508, overlying an isolation dielectric structure 502 (in this example, an STI structure) and gate dielectric 504. In this example of an analog capacitor 500, silicide-block is not present (i.e., has been removed) over poly-silicon element 506. As such, metal silicide 508 has been formed over poly-silicon element 506, consuming some of the poly-silicon element 506 in forming this cladding.

Sidewall nitride elements 510 are formed over sidewall oxide elements 516. Sidewall nitride elements 510 preclude the formation of metal silicide 508 on the sidewall of the poly-silicon element 506. Silicon nitride 512 is disposed over metal silicide 508; over which metal nitride 514 (the top plate of capacitor 500) is deposited and patterned as shown.

Because the upper plate 514 is formed with highly conductive materials (e.g. TaN or TiN) and the lower plate 508 is formed with a high conductive material (silicided poly-silicon), the capacitor 500 has a low temperature coefficient and a low voltage coefficient. A low temperature coefficient and a low voltage coefficient are desirable in an analog capacitor. The capacitor 500 also has high capacitance due to the high dielectric coefficient of the silicon nitride layer 512.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A method of fabricating a floating-gate n-type MOSFET comprising:
   forming a first and a second thick oxide region on a p-type substrate;
   implanting a DNwell (Deep Nwell) region;
   implanting a Pwell region above the DNwell region and between the first and second thick oxide regions; wherein a first portion of the Pwell region abuts a first portion of DNwell region;
   implanting a first Nwell region below the first oxide region; wherein a first portion of the first Nwell region abuts a second portion of the DNwell region; wherein a second portion of the first Nwell region abuts a second portion of the Pwell region;
   implanting a second Nwell region below the second oxide region; wherein a first portion of the second Nwell region abuts a third portion of the DNwell region; wherein a second portion of the second Nwell region abuts a third portion of the Pwell region;
   growing a gate insulation on the Nwell region;
   depositing poly-silicon on the gate insulation;
   etching the poly-silicon to form a poly-silicon gate;
   forming oxide side-walls on sides of the poly-silicon gate;
   implanting a first n-type dopant into the Pwell on both sides of the oxide side-walls forming a source and a drain;
   forming nitride side-walls on the oxide side-walls;
   implanting a second n-type dopant into the source and the drain;
   forming a silicide-blocking layer over the poly-silicon gate, the oxide side-walls, the nitride walls, a first portion of the source and a first portion of the drain;
   forming a silicide on a second portion of the source and on a second portion of the drain;
   forming a nitride layer over the silicide-blocking layer, the poly-silicon gate, the oxide side-walls, the nitride walls, the first portion of the source and the first portion of the drain;

forming a conductive layer over the nitride layer;
forming metal contacts on the second portion of the source and on the second portion of the drain.

2. The method of claim 1 wherein the insulator is selected from a group consisting of an oxide, a nitride, and an oxide/nitride combination.

3. The method of claim 1 wherein the insulator is a high K dielectric insulator.

4. The method of claim 1 wherein the thick oxide region is selected from a group consisting of swallow-trench isolation and locos (local oxidation of silicon) isolation.

5. The method of claim 1 wherein the conductive layer is selected from a group consisting of TaN, TiN and poly-silicon.

6. A method of fabricating a floating-gate n-type MOSFET, an n-type MOSFET and an analog capacitor concurrently comprising:
   forming a first, a second, a third, a fourth, and a fifth thick oxide region on an p-type substrate;
   implanting a DNwell (Deep Nwell) region below the first and second thick oxide regions;
   implanting a first Pwell region above the DNwell region and between the first and second thick oxide regions; wherein a first portion of the first Pwell region abuts a first portion of DNwell region;
   implanting a first Nwell region below the first oxide region; wherein a first portion of the first Nwell region abuts a second portion of the DNwell region; wherein a second portion of the first Nwell region abuts a second portion of the Pwell;
   implanting a second Nwell region below the second oxide region; wherein a first portion of the second Nwell region abuts a third portion of the DNwell region; wherein a second portion of the second Nwell region abuts a third portion of the Pwell;
   implanting a second Pwell region between the third and the fourth thick oxide regions;
   implanting a third Nwell region below the third oxide region; wherein a first portion of the third Nwell region abuts a first portion of the second Pwell region;
   implanting a fourth Nwell region below the fourth oxide region; wherein a first portion of the fourth Nwell region abuts a second portion of the second Pwell;
   growing a gate insulation on the first and second Pwell regions and on the fifth thick oxide region;
   depositing poly-silicon on the gate insulation;
   etching the poly-silicon to form a first, a second and a third poly-silicon portion;
   forming oxide side-walls on sides of the first, the second and the third poly-silicon portions;
   implanting a first n-type dopant into the first and the second Nwells forming a first and a second source and a first and a second drain;
   forming nitride side-walls on the oxide side-walls;
   implanting a second n-type dopant into the first and the second source and the first and the second drain;
   forming a silicide-blocking layer over the first poly-silicon portion, the oxide side-walls of the first poly-silicon portion, the nitride walls of the first poly-silicon portion, a first portion of the first source and a first portion of the first drain;
   forming a silicide on a second portion of the first source, on a second portion of the first drain, on a first portion of the second source, on a first portion of the second drain, on the second poly-silicon portion, and on the third poly-silicon portion;
   forming a nitride layer over the silicide-blocking layer and over the silicide on the third poly-silicon portion;
   forming a conductive layer over the nitride layer;
   forming metal contacts on the second portion of the first source, the second portion of the first drain, the first portion of the second source, and the first portion of the second drain.

7. The method of claim 6 wherein the insulator is selected from a group consisting of an oxide, a nitride, and an oxide/nitride combination.

8. The method of claim 6 wherein the insulator is a high K dielectric insulator.

9. The method of claim 6 wherein the thick oxide region is selected from a group consisting of a swallow-trench isolation and locos (local oxidation of silicon) isolation.

10. The method of claim 6 wherein the conductive layer is selected from a group consisting of TaN, TiN and poly-silicon.

* * * * *